(12) United States Patent
Smith

(10) Patent No.: US 6,309,780 B1
(45) Date of Patent: *Oct. 30, 2001

(54) ATTENUATED PHASE SHIFT MASK AND A METHOD FOR MAKING THE MASK

(75) Inventor: Bruce W. Smith, Webster, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/333,316

(22) Filed: Jun. 15, 1999

Related U.S. Application Data

(63) Continuation-in-part of application No. 09/038,973, filed on Mar. 9, 1998, now Pat. No. 5,939,227.

(51) Int. Cl.$^7$ .................................................. G03F 9/00
(52) U.S. Cl. ........................................................ 430/5
(58) Field of Search ................................. 430/5, 322, 323; 428/210

(56) References Cited

U.S. PATENT DOCUMENTS 6,087,047 * 7/2000 Mitsui et al. ............................ 430/5

OTHER PUBLICATIONS

Website http://www.src.org/Semiconductor Research Corporation ("SRC") Publications: Z98209 Abstract for Optical Properties of Thin Films to 190 nm, L. Zavyalova, B. W. Smith, A. Bourov, and Fonseca, Rochester Institute of Technology, Jun. 30, 1998, 4 pp., (Pub Z98209): Task 403.002.

L. Zavyalova et al., "Optical Properties of Thin Films to 190 nm," *Semiconductor Research Corporation ("SRC") Publications*: Z98209 Abstract, pp. 1–4 (1998).

D. Lide, Ph.D., "The Elements", *CRC Handbook of Chemistry and Physics*, 71$^{st}$ Edition, pp. 4–3504–37 (1990).

J. W. Lutze et al., "Anisotripic Reactive Ion Etching of Aluminum Using $Cl_2$, $BCl_3$, and $CH_4$ Gases", *J. Electronchem. Soc.*, vol. 137, No. 1, pp. 249–252 (1990).

P. Panjan et al., "Optical Properties of Nitride Coatings Deposited At Low Substrate Temperatures", *Vacuum*, vol. 40, pp. 161–164 (1990).

C. Pierrat et al., "Dry Etched Molybdenum Silicide Photomasks For Submicron Integrated Circuit Fabrication", *J. Vac. Sci. Technol. B.*, vol. 9, No. 6, pp. 3132–3137 (1991).

D. Mixon et al., "Patterning Of X–Ray Masks Using The Negative–Acting Resist P (SI–CMS)", *J. Vac. Sci. Technol. B.*, vol. 11, No. 6, pp. 2834–2838 (1993).

A. Callegari et al., "Optical Properties Of Hydrogenated Amorphous–Carbon Film For Attenuated Phase–Shift Mask Applications", *J. Vac. Sci. Tehnol. B*, vol. 11, No. 6, pp. 2697–2699 (1993).

R. Kostelak et al., "Imaging Characterics of Attenuated Phase Shifting Masks", *Proc. Of the OCG Interface Conference*, pp. 125–144 (1993).

S. Ito et al., "Optimization of Optical Properties For Single–Layer Halftone Masks", *SPIE*, vol. 2197, pp. 99–110 (1994).

(List continued on next page.)

Primary Examiner—S. Rosasco
(74) Attorney, Agent, or Firm—Nixon Peabody LLP

(57) ABSTRACT

The attenuated phase shift mask in accordance with one embodiment of the present invention for use in lithography at or below 0.20 μm and for use at wavelengths below 300 nm includes a substrate with a layer deposited on the substrate. The layer comprises a group IV, V or VI transitional metal nitride and silicon nitride $Si_xN_y$. The attenuated phase shift mask has a thickness between about 500 angstroms and 2000 angstroms, where the group IV, V or VI transitional metal nitride comprises about ten to forty percent of the layer.

97 Claims, 9 Drawing Sheets

OTHER PUBLICATIONS

M. Nakajima et al., Attenuated Phase–Shifting Mask With A Single–Layer Absorptive Shifter of CrO, CrON, MoSiO and MoSiON Film, *SPIE*, vol. 2197, pp. 111–121 (1994).

B. W. Smith & S. Turgut, "Phase–Shift Mask Issues for 193 nm Lithography", *SPIE*, vol. 2197, pp. 201–210, (1994).

P. Carcia et al., "Materials Screening For Attenuating Embedded Phase–Shift Photoblanks For DUV and 193 NM Photolithography", *SPIE*, vol. 2884, pp. 255–263 (1996).

B. W. Smith et al., "Attenuated Phase Shift Mask Materials for 248 and 193 nm Lithography", *J. Vac. Sci. Technol. B.*, Vo. 14, No. 6, pp. 3719–3723 (1996).

S. Ito et al., "Passivate $SiN_x$ Halftone Phase Shifting Mask For Deep Ultraviolet Exposure", *J. Vac. Sci. Technol. B.*, vol. 14, No. 6, pp. 4199–4204 (1996).

J. Ushioda et al., "Chromium Fluoride Attenuated Phase–Shifting Mask For Argon Fluoride Excimer Laser Lithography", *Jpn. J. Appl. Phys.*, vol. 35, pp. 6356–6359 (1996).

B. W. Smith, et al., "Plasma Reactive Ion Etching of 193 nm Attenuated Phase Shift Mask Materials", *J. Vac. Sci. Technol. B.*, vol. 15, No. 6, pp. 2259–2447 (1997).

B. W. Smith et al., "Investigation Into Excimer Laser Radiation Damage of Deep Ultraviolet Optical Phase Masking Films", *J. Vac. Sci. Technol. B.*, vol. 15, No. 6, pp. 2444–2447 (1997).

E. Reichmanis et al., "Resist Design Concepts For 193 NM Lithography: Opportunities For Innovation And Invention", *J. Vac. Sci. Technol. B.*, vol. 15, No. 6, pp. 2528–2533 (1997).

B. W. Smith et al., "The Effects of Excimer Laser Radiation on Attenuated Phase–Shift Masking Material", *SPIE*, vol. 3051, pp. 236–244, (1997).

\* cited by examiner

ATTENUATED PHASE SHIFT MASK AND A METHOD FOR MAKING THE MASK

This is a continuation-in-part application of patent application Ser. No. 09/038,973, filed Mar. 9, 1998, now U.S. Pat. No. 5,939,277.

FIELD OF INVENTION

This invention relates generally to an attenuated phase-shift mask, and more particularly, to an attenuated phase shift mask comprising one or more alternating layers of metal nitrides and silicon nitride suitable for use in lithography at or below 0.20 μm for wavelengths below 300 nm.

BACKGROUND OF THE INVENTION

Lithography is a process for producing a pattern on a semiconductor wafer. The pattern is produced by first exposing a pattern etched into a mask onto a semiconductor wafer coated with a resist material. The projected image of the pattern changes the composition of the resist material on the semiconductor wafer which is then removed to leave a matching pattern on the semiconductor wafer for further processing.

Typically, the masks used in lithography each include a substrate which is coated with a film. Depending upon the particular lithography application, the mask needs to satisfy several different requirements. The challenge is in finding a material or materials for use as the film which will satisfy these requirements.

For lithography at or below 0.20 μm and for use at wavelengths at or below 300 nm, an attenuated phase shift mask must have certain optical properties. These optical properties include a transmission between about 1% and 90%, an appropriate phase shift, e.g. a phase shift of about 180 degrees, a refractive index of between about 1.5 and 30, an extinction coefficient between about 0.1 and 1.0 and reflectivity below about 20 percent.

Additionally, the attenuated phase shift mask must have suitable plasma etch characteristics with selectivity to the underlying substrate and to the resist material. In other words, the film on the substrate of the attenuated phase shift mask must be made of a material or materials which can be etched to form the pattern to be replicated on semiconductor wafers without significant loss to the underlying substrate or to the resist material.

Since the intended application of the attenuated phase shift mask is for use with energetic ultra violet (UV) radiation from an excimer laser, the film on the substrate of the attenuated phase shift mask must be able to withstand both short and long term exposure to the UV radiation without significant optical degradation. Typically, damage to the film from exposure to radiation from the excimer laser can be shown to correlate with spatial and temporal peak power density as well as maximum power density and total energy density. Since single laser pulse energy levels from the excimer laser for lithography at or below 0.20 μm are typically low, damage to the attenuated phase shift mask generally results from total energy density from the excimer laser. Damage from long term or cumulative exposure can result from thermo-chemicals effects, the migration of defects, damage to microscopic defects, or surface particle formation. This damage can detrimentally effect the optical properties of the attenuated phase shift mask. Understoichiometric films on substrates are particularly vulnerable to damage from exposure to radiation.

As yet, an appropriate material or materials for use as the film on the substrate of the attenuated phase shift mask for lithography at or below 0.20 μm and for use at wavelengths below 300 nm has not been found.

SUMMARY OF THE INVENTION

The attenuated phase shift mask in accordance with one embodiment of the present invention for use in lithography at or below 0.20 μm and for use at wavelengths below 300 nm includes a substrate with a first layer disposed on the substrate. The layer comprises a group IV, V or VI transitional metal nitride and silicon nitride $Si_xN_y$. The attenuated phase shift mask has a thickness between about 500 angstroms and 2000 angstroms, where the group IV, V or VI transitional metal nitride comprises about ten to forty percent of the layer.

The attenuated phase shift mask in accordance with the present invention provides a number of advantages including providing a mask with either a single layer or multiple layers with appropriate optical properties for use at deep ultraviolet wavelengths, i.e. wavelengths at or below about 300 nm. More specifically, the attenuated phase shift mask provides a transmission between about 1% and 90%, an appropriate phase shift, e.g. a phase shift of about 180 degrees, and a refractive index between about 1.5 and 3.0. Even though the attenuated phase shift mask may have multiple alternating layers, the use of sub-wavelength thicknesses for the film when it is comprised of the multiple layers allows the mask to closely approach the optical properties of a mask with a homogeneous layer of material.

The attenuated phase shift mask also provides suitable etch rates and selectivity. The single layer or alternating layers of $Si_xN_y$ and a group IV, V or VI transitional metal nitride on the substrate can be etched using techniques, such as plasma reactive ion etching, without significant loss of the underlying substrate or the resist material.

Further, the attenuated phase shift mask is able to withstand both the short and long term effects of exposure to radiation from and excimer laser at or below 300 nm without significant optical degradation. When exposed to prolonged radiation, the attenuated phase shift mask in accordance with the present invention experiences a phase shift change of only about +/−one degree or less, a transmission modification of only about 0.5 percent or less, and a change in refractive index of only about 0.6 percent or less. The stoichiometric nature of the single layer or alternating layers of $Si_xN_y$ and a metal nitride on the substrate, makes the attenuated phase shift mask inherently less prone to damage.

DETAILED DESCRIPTION

Figure 1:
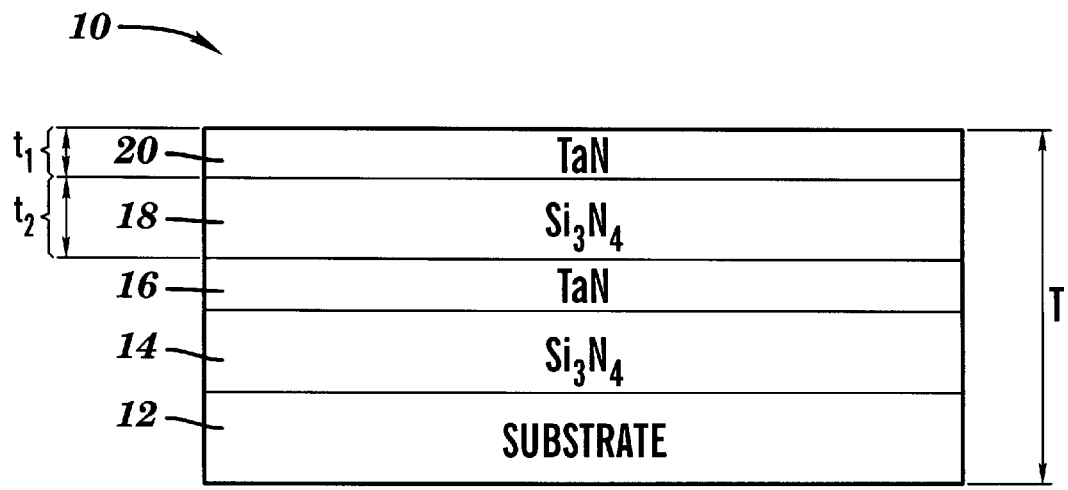
FIG. 1 is a cross-sectional view of an attenuated phase shift mask in accordance with one embodiment of the present invention.

An attenuated phase shift mask 10 in accordance with one embodiment of the present invention for use in lithography is illustrated in FIG. 1. The attenuated phase shift mask 10 includes a substrate 12, a first layer 14 disposed on the substrate, and a second layer 16 disposed on the first layer 14. The first layer 14 is a group IV, V or VI transitional metal nitride and the second layer 16 is $Si_xN_y$ or the first layer 14 is $Si_xN_y$ and the second layer 16 is a group IV, V or VI transitional metal nitride. The mask may include a third layer 18 disposed on the second layer 16 and a fourth layer 20 disposed on the second layer 16. The third layer 18 is a group IV, V or VI transitional metal nitride if the second layer 16 is $Si_xN_y$ and is $Si_xN_y$ if the second layer 16 is a group IV, V or VI transitional metal. The fourth layer 20 is a group IV, V or VI transitional metal nitride if the third layer 18 is $Si_xN_y$ and is $Si_xN_y$ if the third layer 18 is a group IV, V or VI transitional metal. The attenuated phase shift mask 10 in accordance with the present invention provides a number of advantages including providing a mask with appropriate optical characteristics, excellent etch selectivity with respect to the substrate and resist material, and the ability to withstand radiation at or below 300 nm without significant optical degradation.

Referring to FIG. 1, the attenuated phase shift mask 10 includes the substrate 12. In this particular embodiment, the substrate 12 is made of fused silica, although other types of materials, such as quartz, fluorides, or other glasses, can be used as the substrate 12 as needed or desired. Preferably, the substrate 12 has a thickness between about 500 angstroms and 2000 angstroms.

A stacked approach of layers made of radiation stable and good etch selectivity materials has been taken to form a $TaN/Si_xN_y$ film on the substrate 12, where stoichiometric nitrides allow for appropriate optical properties. In this particular embodiment, the film includes a first layer 14 of silicon nitride is disposed on the substrate 12, a second layer 16 of tantalum nitride is disposed on the first layer 14 of silicon nitride, a third layer 18 of silicon nitride is disposed on the second layer 16 of tantalum nitride, and a fourth layer 20 of tantalum nitride is disposed on the third layer 18 of silicon nitride. Although in this particular embodiment four alternating layers 14, 16, 18, and 20 of silicon nitride and tantalum nitride are illustrated, the mask could have more than four layers or could have as few as one layer of each material as needed or desired. Additionally, the order in which the silicon nitride and tantalum nitride are formed on the substrate can be switched as needed or desired. Further, although tantalum nitride (TaN) and silicon nitride ($Si_3N_4$) are shown, any group IV, V or VI transitional metal nitride can be used and any silicon nitride ($Si_xN_y$) can be used. One of the advantages the present invention is that the layers 14, 16, 18, and 20 of the mask 10 not only have the appropriate optical properties for lithography at or below 0.20 μm and for use at wavelengths below 300 nm, but also are made from materials which are radiation stable and etch selective. In other words, the materials for the layers 14, 16, 18, and 20 remain optically stable even when exposed to the short and long terms effects of radiation from a source, such as an excimer laser, under which the mask 10 is normally exposed during their useful life and do not experience a significant loss to the underlying substrate or to the resist material when etched. By way of example only, radiation stable materials for the mask 10 do not experience a transmission change of more than about 0.5% during the useful life of the mask 10 and have an etch selectivity of about 5:1 or more with respect to the substrate 12 and 2:1 or more with respect to the resist material.

Figure 2A:
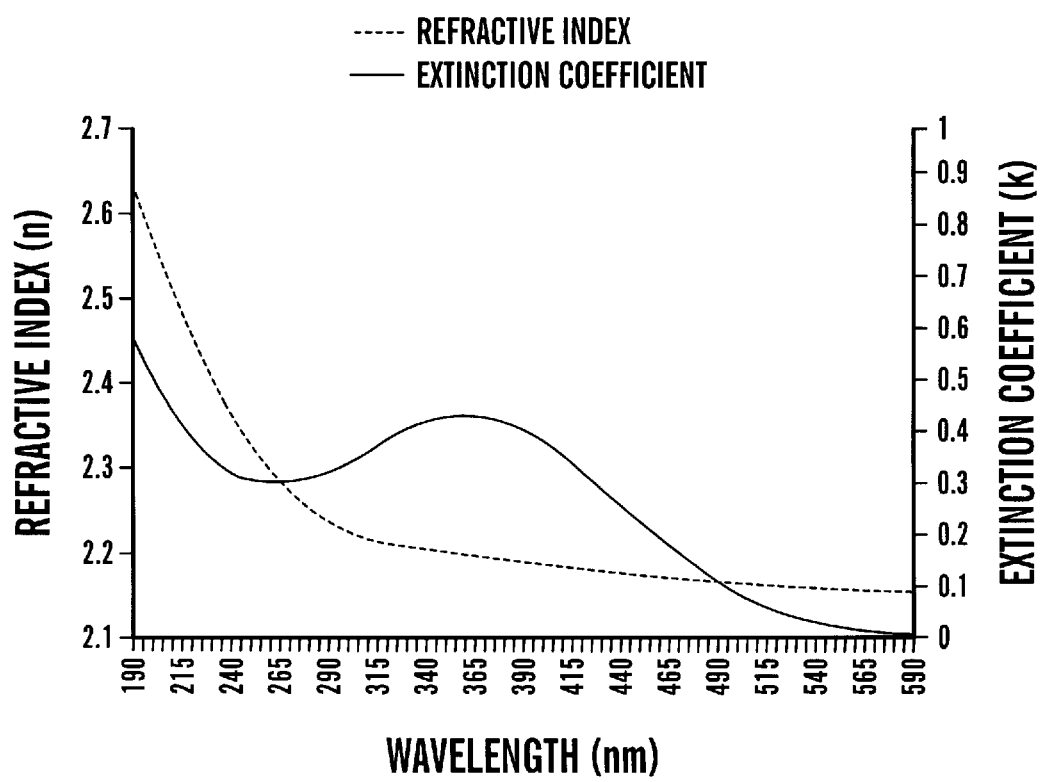
FIG. 2A is a graph illustrating the refractive index and extinction for the attenuated phase shift mask shown in FIG. 1.
Figure 2B:
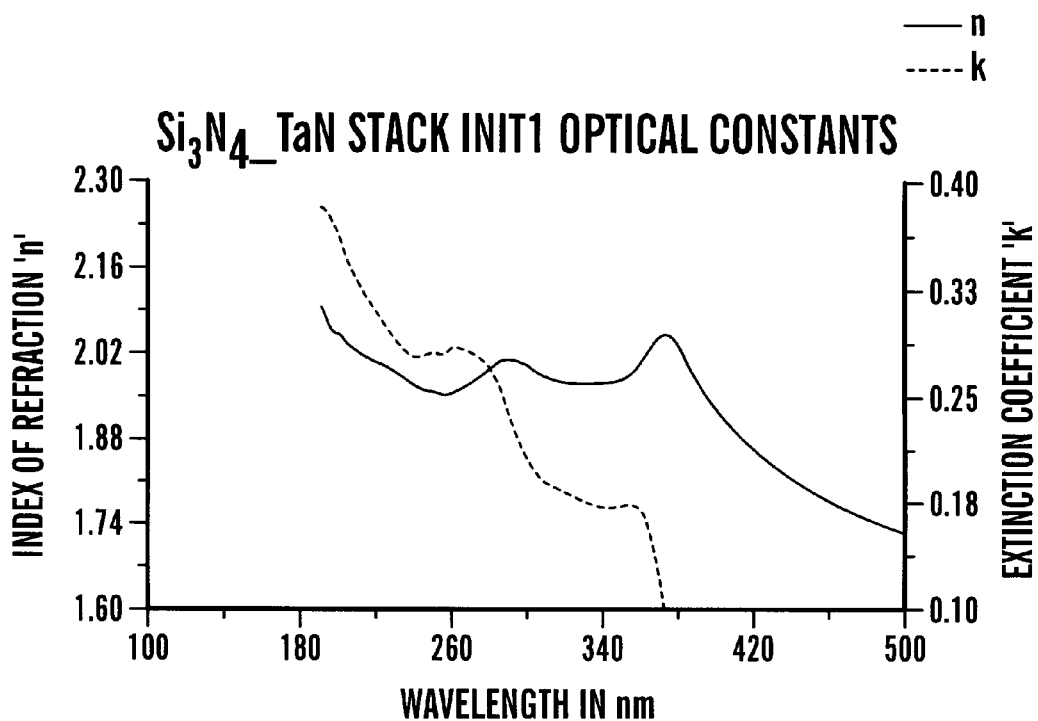
FIG. 2B is a graph illustrating the index of refraction for the attenuated phase shift mask shown in FIG. 1 as a function of wavelength.
Figure 2C:
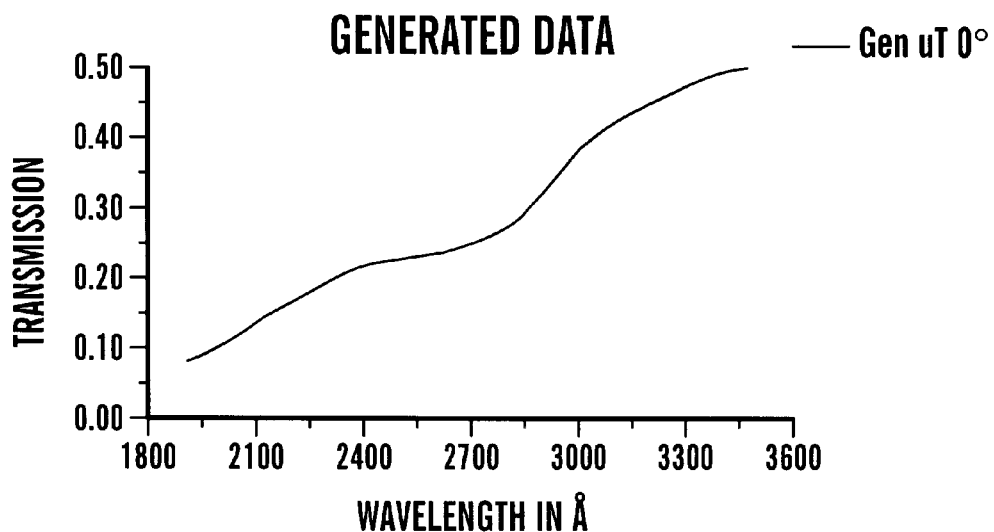
FIG. 2C is a graph illustrating the index of transmission for the attenuated phase shift mask shown in FIG. 1 as a function of wavelength.

The optical properties of the attenuated phase shift mask with the substrate 12 and the alternating four layers 14, 16, 18 and 20 are illustrated in FIGS. 2A–2C and are set forth in the table below:

| Film | n (193) | k (193) | thickness (Å) | Transmission | Reflectivity |
|---|---|---|---|---|---|
| TaN/SiN | 2.62 | 0.57 | 595 | 11% | 19% |

Although reflectivity of the film for the attenuated phase shift mask 10 in this example is 19%, this number can be reduced simply by placing the lower index layer at the top surface, i.e. the surface opposite from the substrate 12.

Preferably, the attenuated phase shift mask 10 has a thickness T ranging between about 500 angstroms and 2000 angstroms. More preferably, the attenuated phase shift mask 10 has a thickness T of about 600 angstrom. The use of a sub-wavelength thickness for the combined thickness of the layers 14, 16, 18, and 20 of the attenuated phase shift mask 10 allows the mask 10 to approach the optical properties of a mask with a homogeneous or continuous layer of material. Each layer 16 and 20 of tantalum nitride has a thickness $t_1$ and each layer 14 and 18 of silicon nitride as a thickness of $t_2$. In this particular embodiment, the thickness $t_1$ ranges between about five angstroms and fifty angstroms and the thickness $t_2$ ranges between about thirty angstroms and three-hundred angstroms. Preferably, the ratio of the thickness of the silicon nitride layer to the tantalum nitride is about 85 to 15 (85:15).

As discussed above, the layers 14, 16, 18, and 20 that make up the attenuated phase shift mask 10 can be made so thin that the mask 10 or film is essentially continuous. In such an embodiment, the thickness of each layer 14, 16, 18, and 20 is on the order of a few angstroms. By way of example only, such a mask 10 can be created by sputter deposition in a system with multiple targets powered and rotating the substrate under targets at a high rate compared to the deposition rate.

Figure 7:
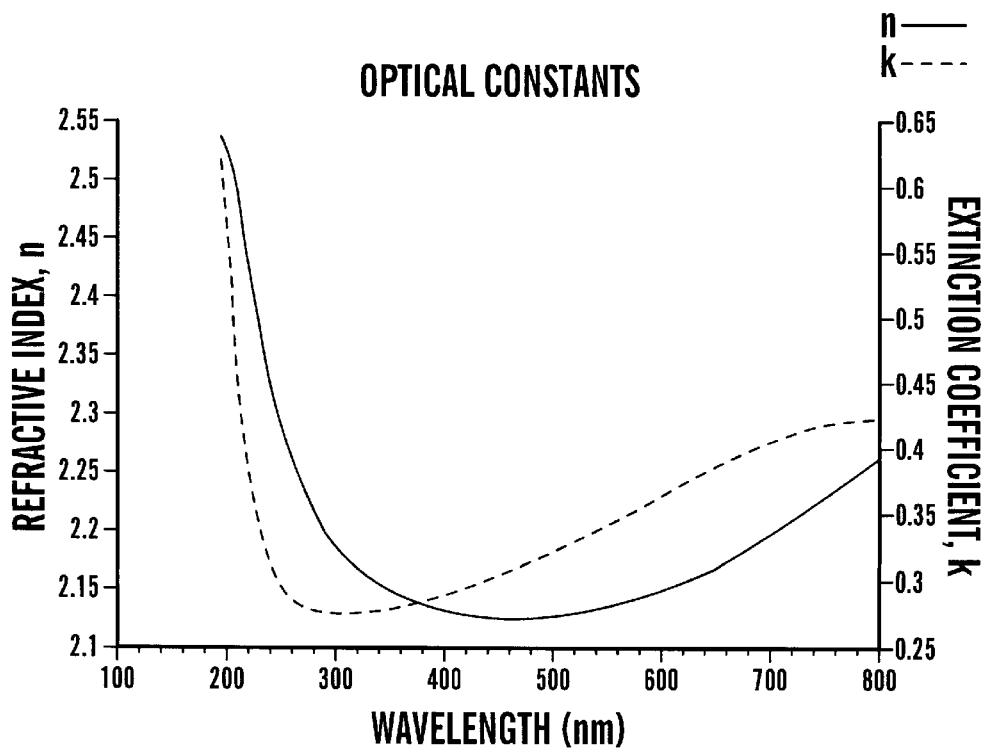
FIG. 7 is a graph illustrating the index of refraction for a 193 nm attenuated phase shift mask with molybdenum nitride and silicon nitride deposited as a single layer as a function of wavelength.
Figure 8:
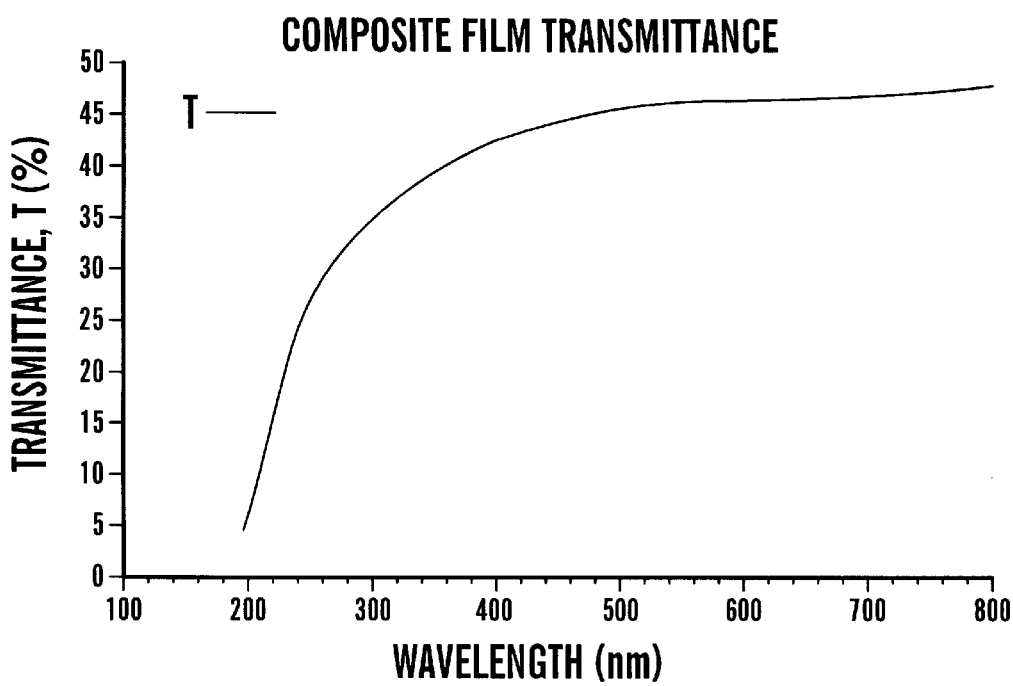
FIG. 8 is a graph illustrating the transmittance of the phase shift mask shown in FIG. 7 as a function of wavelength.
Figure 9:
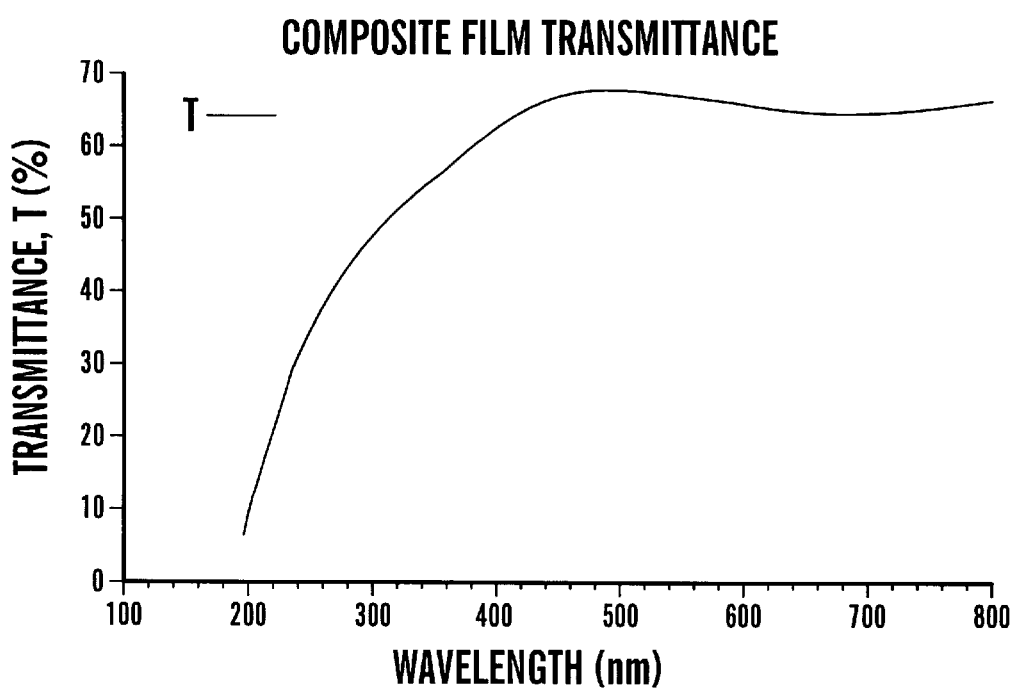
FIG. 9 is a graph illustrating the transmission of a 193 nm attenuated phase shift mask made up of TiN combined with $Si_3N_4$.
Figure 10:
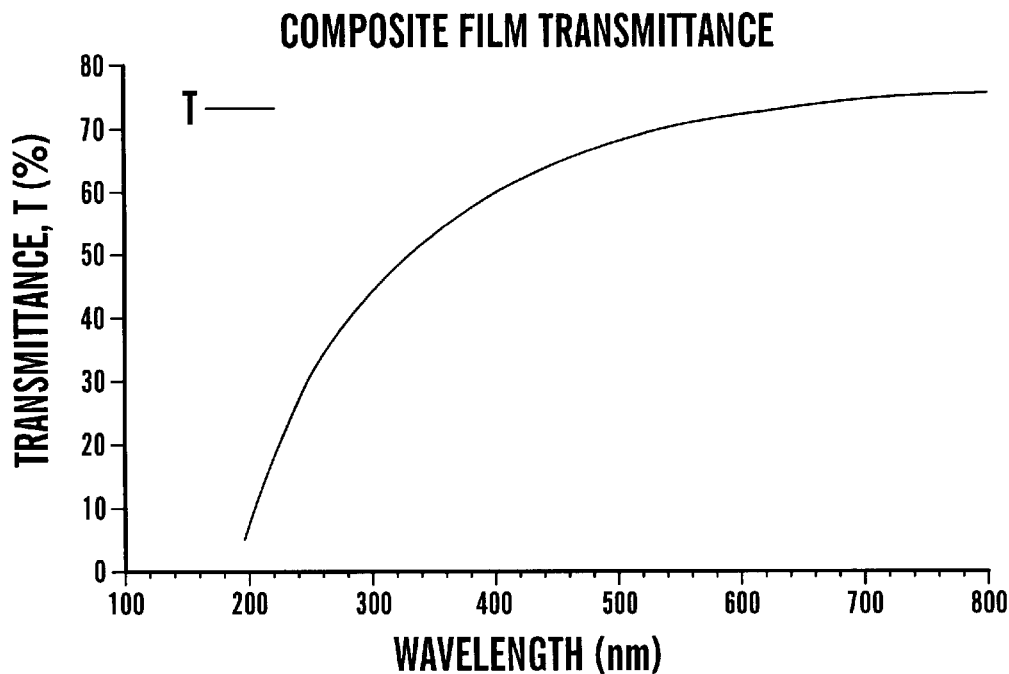
FIG. 10 is a graph illustrating the transmission of a 193 nm attenuated phase shift mask made up of WN combined with $Si_3N_4$.
Figure 11:
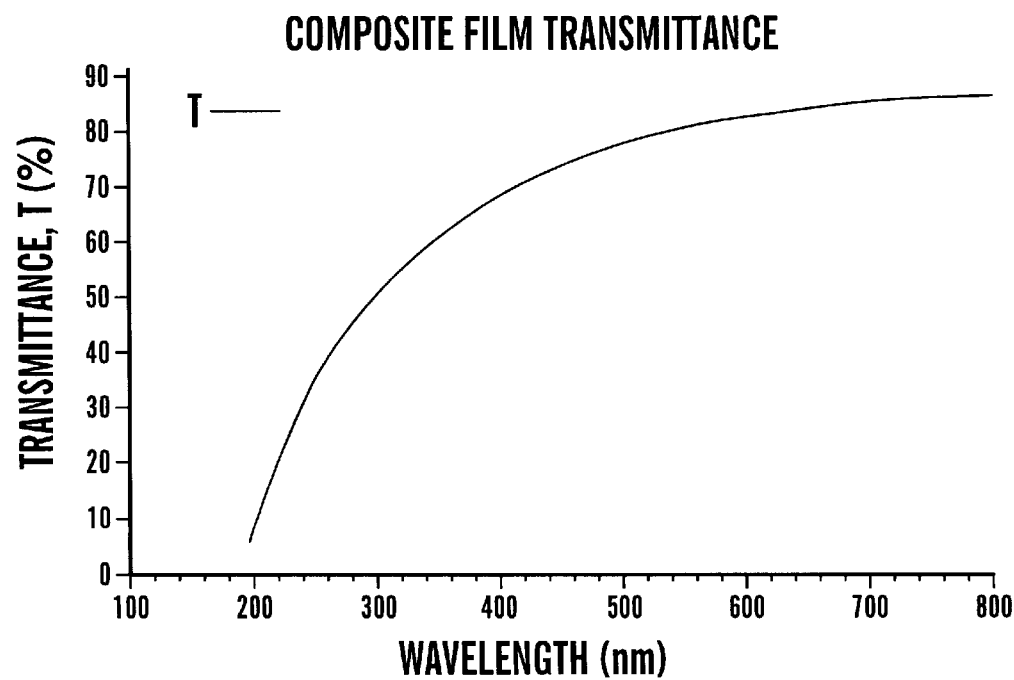
FIG. 11 is a graph illustrating the transmission of a 193 nm attenuated phase shift mask made up of NbN combined with $Si_3N_4$.

In yet another embodiment, the desired ratios of metallic nitride (any group IV, V or VI transitional metal nitride) to silicon nitride ($Si_xN_y$) can be incorporated into the attenuated phase shift mask 10 using co-deposition methods. This can be accomplished through use of a mosaic or a composite target. The target can be elemental (that is group IV, V, or VI metal nitride and silicon nitride). Deposition is accomplished from a single target and the resulting attenuated phase shift mask 10 is homogeneous. By way of example only, the optical constants and composite film transmittance of a single layer film of $MoN/Si_3N_4$ in accordance with this embodiment are illustrated in FIGS. 7 and 8. More specifically, the composite $MoN/Si_3N_4$ attenuated phase shift mask 10 has a phase shift thickness at 193 nm of 646 angstrom. Although in this example MoN is used, other metallic nitrides such as TiN, WN, NbN, TaN, ZrN, CrN, and other nitrides of groups IV, V, or V can also be used. Additionally, these metallic nitrides can be deposited in multiple layers instead of as a single continuous layer. By way of example, FIGS. 9–11 show the transmission plots for 193 nm attenuated phase shift films using TiN, WN, and NbN with $Si_3N_4$. Referring to FIG. 9, the transmission of a 193 nm attenuated phase shift mask made up of TiN combined with $Si_3N_4$. A pi phase shift is achieved at 652 Å and transmission at 193 nm is 8.5%. Referring to FIG. 10, The transmission of a 193 nm attenuated phase shift mask made up of WN combined with $Si_3N_4$. A pi phase shift is achieved at 613 Å and transmission at 193 nm is 6.44%. Referring to FIG. 11, the transmission of a 193 nm attenuated phase shift mask made up of NbN combined with $Si_3N_4$. A pi phase shift is achieved at 597 Å and transmission at 193 nm is 8.3%.

Figure 5:
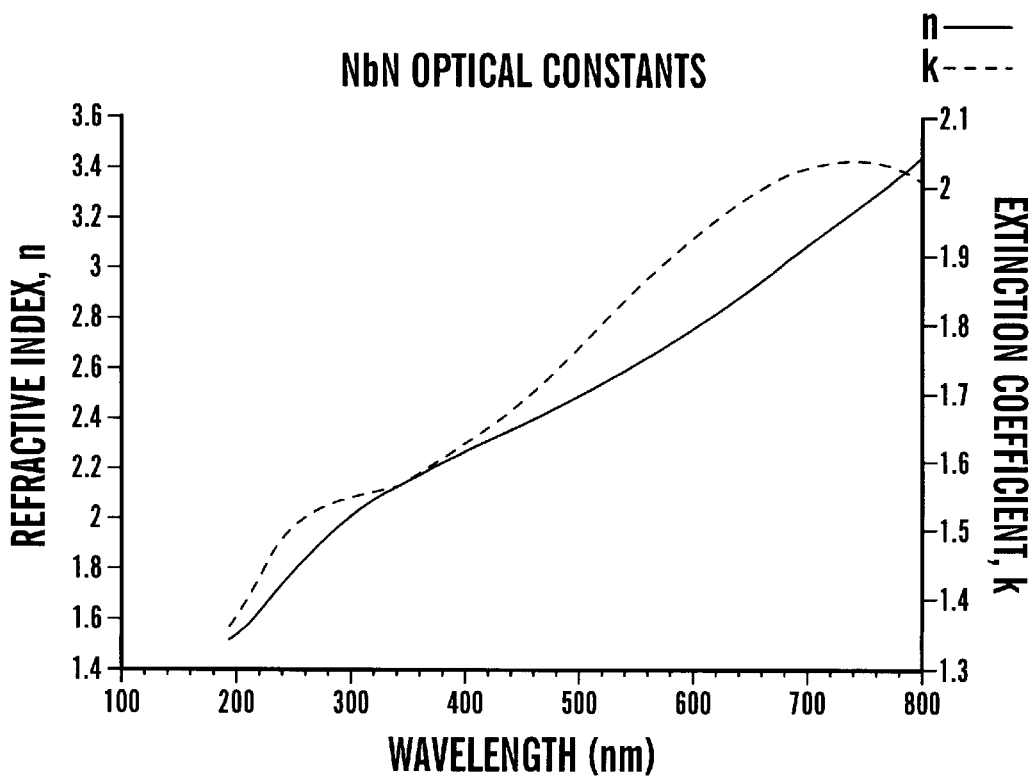
FIG. 5 is a graph illustrating the index of refraction for molybdenum nitride as a function of wavelength for use with silicon nitride for an attenuated phase shift mask.
Figure 6:
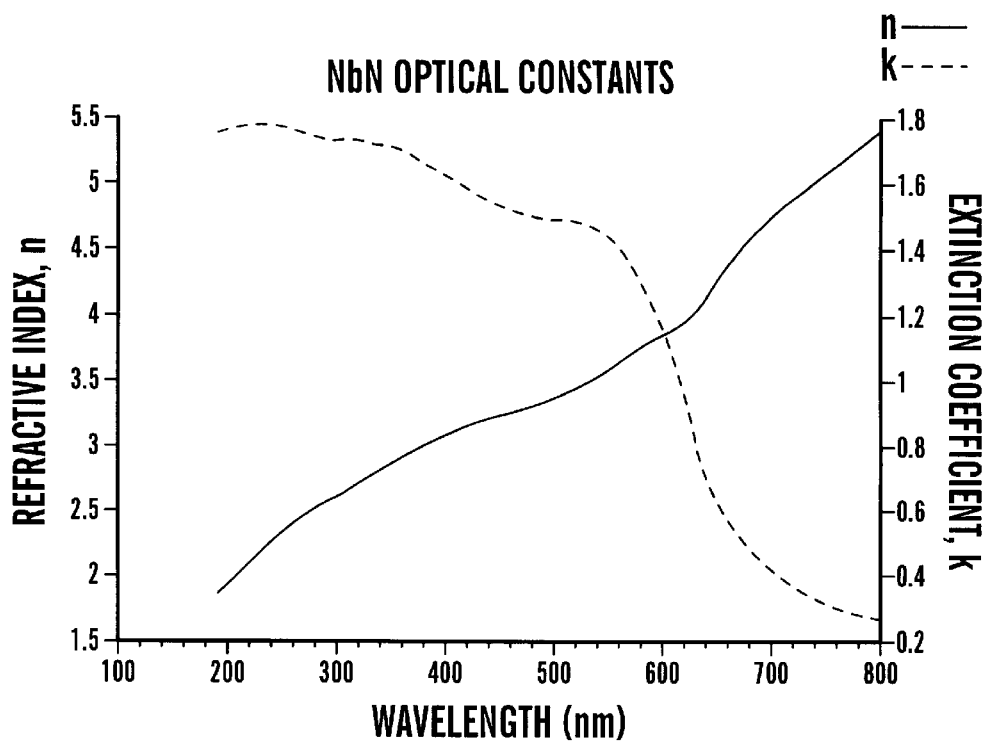
FIG. 6 is a graph illustrating the index of refraction for niobium nitride as a function of wavelength for use with silicon nitride for an attenuated phase shift mask.

By way of example only, the optical constants of a film of MoN deposited in layers is illustrated in FIG. 5. In this example, an attenuated phase shift mask 10 results when the MoN comprises between about ten to forty percent of the combination of MoN and $Si_xN_y$. In FIG. 6, the optical constants of a film of NbN is illustrated. In this example, an attenuated phase shift mask 10 results when the NbN comprises between about ten to forty percent of the combination of NbN and $Si_xN_y$.

The attenuated phase shift mask 10 in accordance with the present invention provides several advantages, including providing appropriate optical properties for lithography at or below 0.20 μm for wavelengths below 300 nm. The attenuated phase shift mask 10 also provides a suitable etch rate and selectivity. Preferably, the mask 10 is etched with a fluorine-based etching plasma, such as $SF_6$ or $CF_4$ combined with oxygen or hydrogen which allows for maximum etch rate, selectivity, and anisotropy for the attenuated phase shift mask 10. The attenuated phase shift mask 10 is also able to withstand both the short and long term effects of exposure to radiation from an excimer laser at or below 300 nm without significant optical degradation. These advantages are illustrated in the experiments discussed below.

EXPERIMENTS
Background for Experiments

Deposition of materials to from the films on the substrates was carried out by rf magnetrom sputtering of 8" targets in argon with nitrogen or oxygen. Films were sputtered at power levels between 500 W and 1500 W with an evacuated pressure of $-1 \times 10^{-7}$ Torr onto fused silica substrates approximately 1.5×1.5×0.090". Prior to sputtering, substrates were cleaned and dehydrated to reduce reactivity with oxygen. Films were deposited without additional substrate heating.

Optical evaluation of reflectance and transmittance was carried out with UV/visible spectrophotometry at wavelengths from 190 to 900 nm using a Perkin Elmer Lambda 11 spectrophotometer. From these measurements, refractive index and extinction coefficient data was extracted through solution of Fresnel equations. Additionally, spectroscopic ellipsometry was conducted on TaN and $Si_3N_4$ films using a Woollam WVASE system. Thickness measurement was performed using profilometry (Dektak) and atomic force microscopy.

Plasma etching was carried out in a modified Plasma Therm RIE system utilizing a single wafer parallel plate chamber. The lower electrode is 15.2 cm in diameter and was not cooled during operation. The electrode was modified to allow for uniform etching of small fused silica samples. The chamber was not load locked and was pumped down typically below $10^{-5}$ torr before processing. Samples of thermal silicon dioxide ($SiO_2$ over silicon) were etched for evaluation of selectivity. Etch rates were determined by measuring etch step heights on a Dektak profilometer. Etch gases studied included fluorine, chlorine, and bromine chemistries ($Cl_2CCl_4$, HBr, $Cl_2/CF_4$, $BCl_3$, $SF_6$, $CF_4$, and combinations with Ar and H).

Examination of Etch Rates and Selectivity

An investigation of the etching properties of the film of layers 14, 16, 18, and 20 on a substrate 12 for attenuated phase shift mask 10 was conducted by evaluating the etch properties of TaN and $Si_3N_4$ and etch selectivity to $SiO_2$ and resist material when etched with $SF_6$. In this experiment, the power was held constant at about 200 Watts and the flow of $SF_6$ was 30 sccm.

Figure 3A:
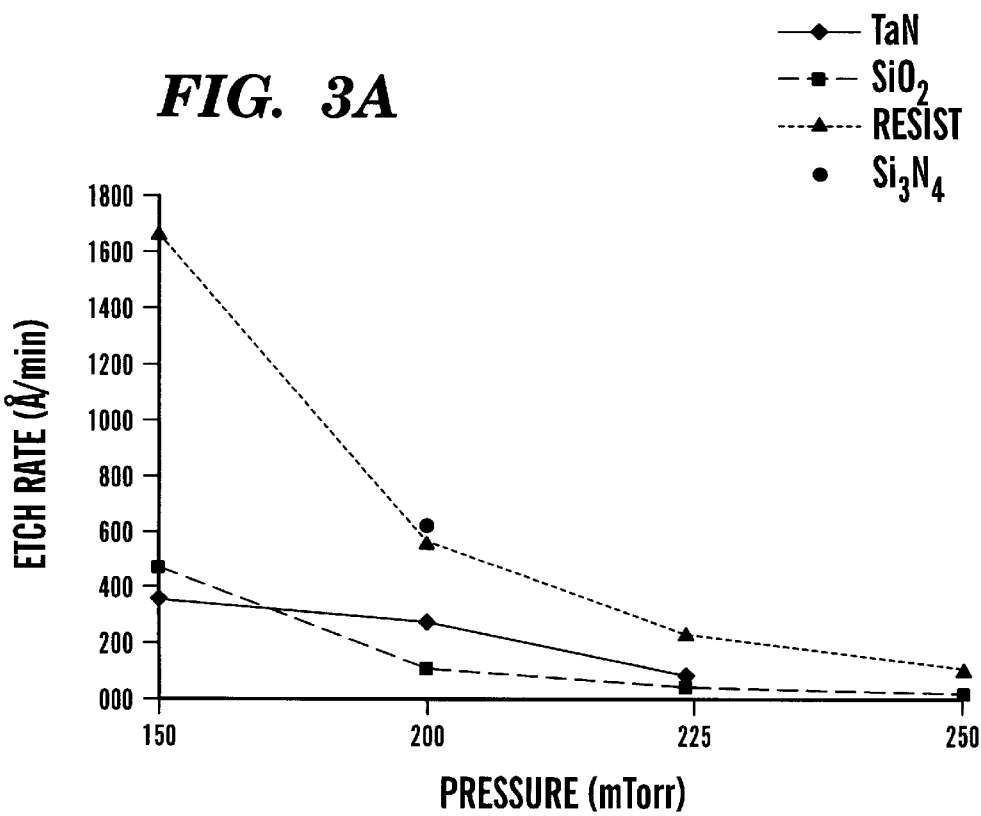
FIG. 3A is a graph illustrating the etch rates of TaN, $SiO_2$, $Si_3N_4$, and a resist material as a function of pressure.
Figure 3B:
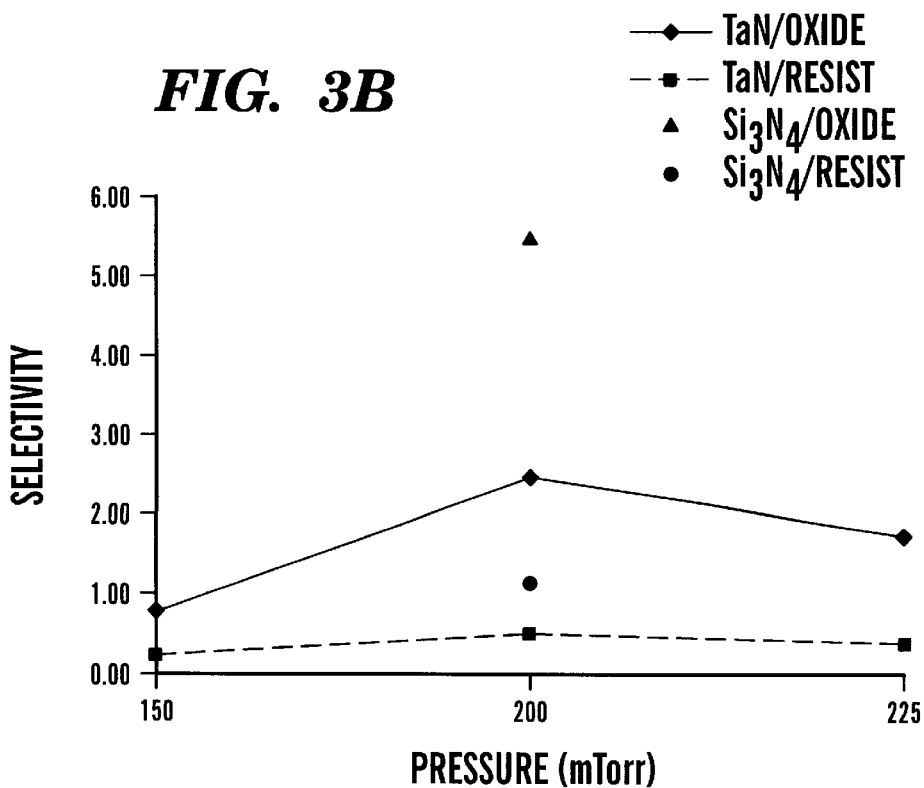
FIG. 3B is a graph illustrating the selectivity of TaN and $Si_3N_4$ to $SiO_2$ and to resist as a function of pressure.

Referring to FIGS. 3A and 3B, the etch rates of TaN, $SiO_2$, and resist material as a function of pressure from 150 to 250 mTorr and the etch rate of $Si_3N_4$ at 200 mTorr and the selectivity of TaN to $SiO_2$ and TaN to resist material are illustrated. As these graphs illustrate, the etch rates of TaN, $SiO_2$ and resist decrease with pressure, but selectivity of TaN to $SiO_2$ and TaN to resist material is maximum near 200 mTorr at 2.5:1 and 0.5:1 respectively.

Figure 3C:
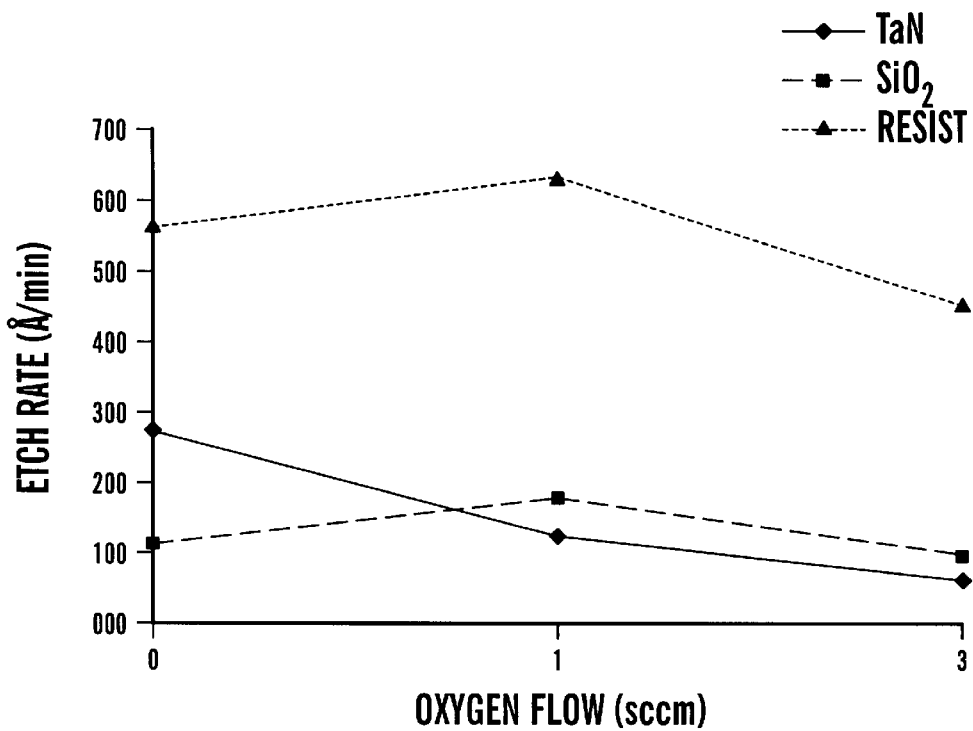
FIG. 3C is a graph illustrating the etch rates of TaN, $SiO_2$ and a resist material as a function of oxygen flow.

Referring to FIG. 3C, the contribution of oxygen to etching the film of layers 14, 16, 18, and 20 for attenuated phase shift mask 10 was investigated next. As illustrated, the addition of oxygen, increases the etch rate of $SiO_2$, but decreases the etch rate of tantalum nitride TaN. The increase in the etch rate of $SiO_2$ can be attributed to an increase in fluorine radicals. The detrimental decrease in the etch rate of tantalum nitride may be due to dilution and the lower volatility of tantalum oxifluorides compared to tantalum fluorides.

Figure 3D:
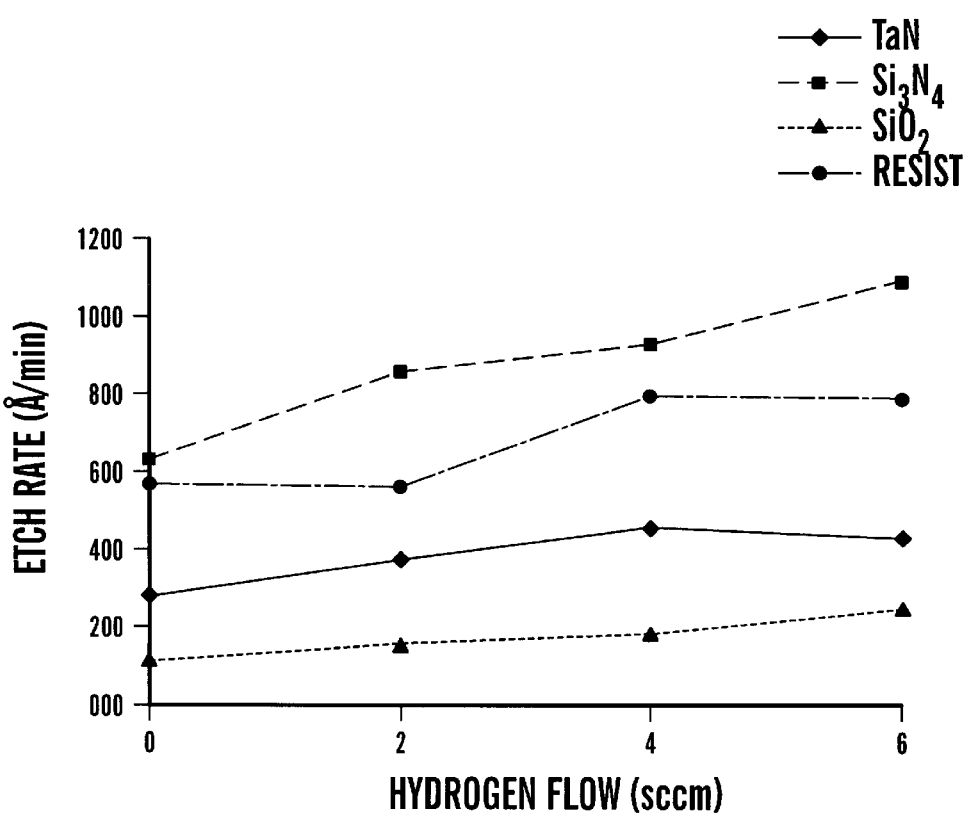
FIG. 3D is a graph illustrating the etch rates of TaN, $Si_3N_4$, $SiO_2$ and a resist material as a function of hydrogen flow.

Referring to FIG. 3D, the addition of hydrogen to the fluorine etch process was also investigated for $Si_3N_4$, TaN, resist material, and $SiO_2$ for hydrogen flow from 0 to 6 sccm at 200 W, 200 mTorr, and 30 sccm SF6. When etching $SiO_2$, the addition of hydrogen can be offset by the liberation of oxygen and thus has little effect on etch rate. However, the etching of other films can be impacted as hydrogen ($H_2$) scavenges fluorine. This can modify the availability of other gas constituents and help increase physical etch activity.

Figure 3E:
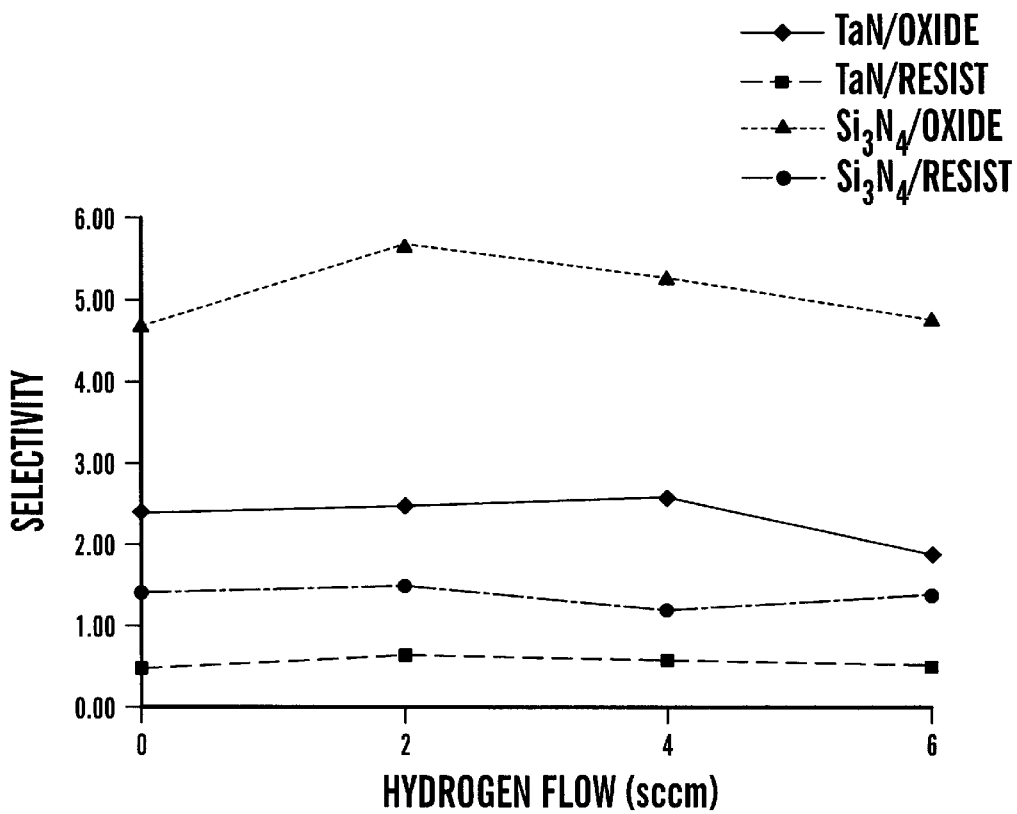
FIG. 3E is a graph illustrating the selectivity of TaN and $Si_3N_4$ to $SiO_2$ and to a resist material as a function of hydrogen flow.

Referring to FIG. 3E, the selectivity ratios of TaN and $Si_3N_4$ to resist material and to $SiO_2$ are illustrated. As the graph illustrates, selectivity values are maximized at a hydrogen flow of 2 sccm.

Etch results for the film of layers 14, 16, 18, and 20 on a substrate 12 for attenuated phase shift mask 10 are summarized in the table below:

| Film | Etch chemistry | Fused silica | Resist | Comments |
|------|----------------|--------------|--------|----------|
| TaN/SiN | $SF_6$/H | >5:1 | >2:1 | Good selectivity |

As this investigation illustrates, an attenuated phase shift mask 10 with a film of alternating layers 14, 16, 18, and 20 of tantalum nitride and silicon nitride on a substrate 12 can allow for high etch rates in $SF_6$/H plasma chemistries with adequate selectivity to both fused silica and resist material. The etching process and testing results of the film of layers 14, 16, 18, and 20 on a substrate 12 for attenuated phase shift mask 10 described above along with other tests are explained in greater detail in Bruce Smith, et al., "Plasma reactive ion etching of 193 nm attenuated phase shift mask materials," J. Vac. Sci. Technol. B. (1997), which is herein incorporated by reference.

Examination of Optical Degradation From Exposure

An investigation of the stability of attenuated phase shift masks, including an attenuated phase shift mask 10 with a film of alternating layers 14, 16, 18, and 20 of tantalum nitride and silicon nitride on a substrate 12, was conducted. A Cymer CX2LS excimer laser running at 193 nm with ArF with pulse width near 20 ns at 100 Hz repetition rate was used as the source of radiation. Radiation at 193 nm was selected because it was likely to lead to the greatest extent of modification to the masks via cumulative damage mechanisms and oxidative effects. The attenuated phase shift masks were subjected to cumulative exposure levels that would typically be experienced during the lifetime of an attenuated phase shift mask. Using a 25 mJ/cm$^2$ resist sensitivity value and 40% throughout for a five times (5×) reduction optical system, a 2.5 mW/cm nominal mask plane irradiance is required for 100 pulse wafer exposures. Films were subjected to 25 mW/cm$^2$ at 100 Hz to deliver exposure energy density values up to 3×10$^3$ J/cm$^2$. Transmission, reflectance, and ellipsometric measurements were made on the attenuated phase shift masks before and after exposure to 193 nm radiation.

Figure 4A:
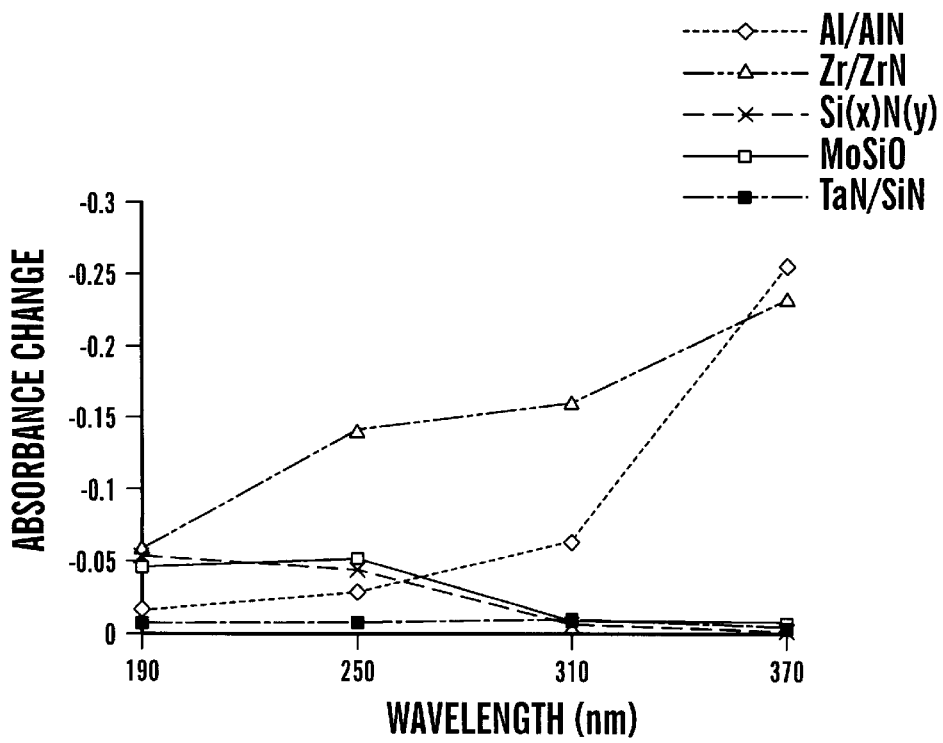
FIG. 4A is a graph illustrating the absorbance change in the attenuated phase shift mask shown in FIG. 1 as a function of wavelength.

Referring to FIG. 4A, a plot of the resulting changes in absorbance of five different films on substrates, including a film of alternating layers 14, 16, 18, and 20 of tantalum nitride and silicon nitride on a substrate 12, is illustrated. The values in the graph were determined from n and k values fitted to measured data. For a 10% transmitting film in an attenuated phase shift mask, an absorbance change of 0.049 corresponds to a 0.5% transmission change. As illustrated in the graph, the stoichiometric TaN/$Si_3N_4$ film (i.e. the film of alternating layers 14, 16, 18, and 20 of tantalum nitride and silicon nitride on a substrate 12) exhibits no optical degradation at the levels of radiation tested.

Figure 4B:
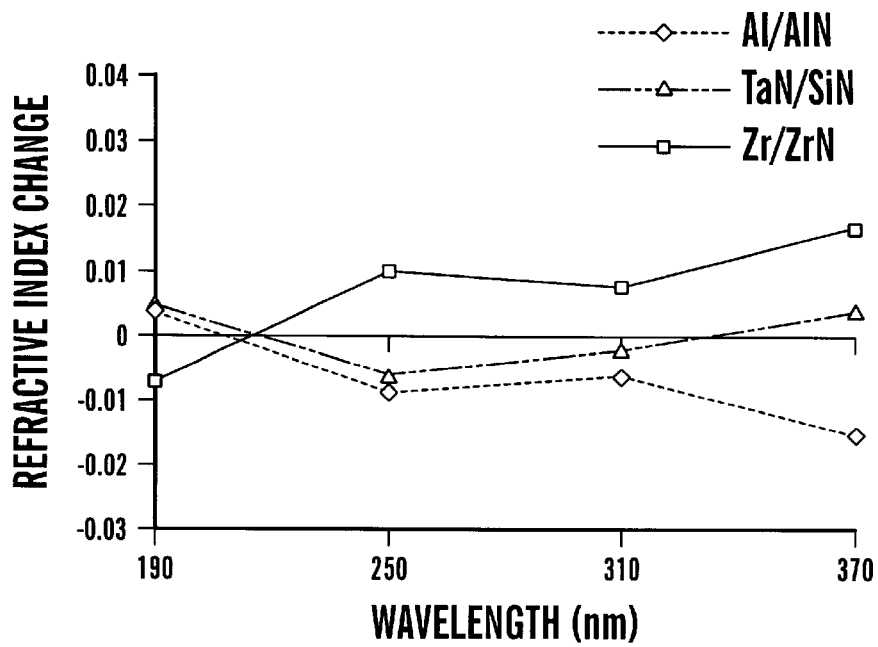
FIG. 4B is a graph illustrating the refractive index change in the attenuated phase shift mask shown in FIG. 1 as a function of wavelength.

Referring to FIG. 4B, a plot of the resulting changes in absorbance of five different films on substrates, including a film of alternating layers 14, 16, 18, and 20 of tantalum nitride and silicon nitride on a substrate 12, is illustrated. As illustrated in the graph, the film of alternating layers 14, 16, 18, and 20 of tantalum nitride and silicon nitride on a substrate 12 only experienced a refractive index change of 0.0056. Accordingly, when exposed to short and long term radiation from an excimer laser, the attenuated phase shift mask 10 with a film of alternating layers 14, 16, 18, and 20 of tantalum nitride and silicon nitride on a substrate 12 shows no significant modification to optical properties and is attractive as a stable material for mask application.

The investigation of the effects short and long term radiation from an excimer laser on the attenuated phase shift mask 10 with a film of alternating layers 14, 16, 18, and 20 of tantalum nitride and silicon nitride on a substrate 12 as well as on other attenuated phase shift masks is explained in greater detail in Bruce Smith, et al., "Plasma reactive ion etching of 193 nm attenuated phase shift mask materials" J. Vac. Sci. Technol. B 15 [6] p. 2444 (1997) and Bruce Smith, et al., "The Effects of Excimer Laser Radiation on Attenuated Phase-Shift Masking Materials" Id. at 2259 which are herein incorporated by reference.

Summary

For an attenuated phase shift mask for use in lithography at or below 0.20 μm and for use at wavelengths below 300 nm to be considered viable, the mask must have appropriate optical properties, suitable plasma etch characteristics and selectivities, and the ability to withstand short and long term exposure to radiation from an excimer laser without significant optical degradation. As illustrated in the examples above, an attenuated phase shift mask with a film comprising continuous or alternating layers of group IV, V, or VI metal nitrides and $Si_3N_4$ on a substrate satisfies each of these requirements.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An attenuated phase shift mask for use in lithography comprising:
    a substrate; and
    a layer comprising a group IV, V or VI transitional metal nitride and silicon nitride $Si_xN_y$ disposed on the substrate.

2. The attenuated phase shift mask according to claim 1 wherein the group IV, V or VI transitional metal nitride comprises MoN and the silicon nitride $Si_xN_y$ comprises $Si_3N_4$.

3. The attenuated phase shift mask according to claim 1 wherein the group IV, V or VI transitional metal nitride comprises NbN and the silicon nitride $Si_xN_y$ comprises $Si_3N_4$.

4. The attenuated phase shift mask according to claim 1 wherein the group IV, V or VI transitional metal nitride comprises TiN and the silicon nitride $Si_xN_y$ comprises $Si_3N_4$.

5. The attenuated phase shift mask according to claim 1 wherein the group IV, V or VI transitional metal nitride comprises WN and the silicon nitride $Si_xN_y$ comprises $Si_3N_4$.

6. The attenuated phase shift mask according to claim 1 wherein the mask has a thickness between about 500 angstroms and 2000 angstroms.

7. The attenuated phase shift mask according to claim 1 wherein the layer is continuous.

8. The attenuated phase shift mask according to claim 1 wherein the group IV, V or VI transitional metal nitride comprises about ten to forty percent of the layer.

9. The attenuated phase shift mask according to claim 1 wherein the layer is radiation stable and etch selective.

10. The attenuated phase shift mask according to claim 9 wherein the layer has an etch selectivity of about 5:1 or more to the substrate and 2:1 or more to the resist material.

11. The attenuated phase shift mask according to claim 1 wherein the layer experiences a transmission change of no more than about 0.5% during the useful life of the mask.

12. A method for making an attenuated phase shift mask for use in lithography, the method comprising:
providing a substrate; and
co-depositing a group IV, V or VI transitional metal nitride and silicon nitride $Si_xN_y$ on the substrate to form a single layer.

13. The method according to claim 12 wherein the group IV, V or VI transitional metal nitride comprises MoN and the silicon nitride $Si_xN_y$ comprises $Si_3N_4$.

14. The method according to claim 12 wherein the group IV, V or VI transitional metal nitride comprises NbN and the silicon nitride $Si_xN_y$ comprises $Si_3N_4$.

15. The method according to claim 12 wherein the group IV, V or VI transitional metal nitride comprises TiN and the silicon nitride $Si_xN_y$ comprises $Si_3N_4$.

16. The method according to claim 12 wherein the group IV, V or VI transitional metal nitride comprises WN and the silicon nitride $Si_xN_y$ comprises $Si_3N_4$.

17. The method according to claim 12 wherein the mask is formed to have a thickness between about 500 angstroms and 2000 angstroms.

18. The method according to claim 12 wherein the layer is continuous.

19. The method according to claim 12 wherein the group IV, V or VI transitional metal nitride comprises about ten to forty percent of the layer.

20. The method according to according to claim 12 wherein the layer is radiation stable and etch selective.

21. The method according to claim 20 wherein the layer has an etch selectivity of about 5:1 or more to the substrate and 2:1 or more to the resist material.

22. The method according to claim 12 wherein the layer experiences a transmission change of no more than about 0.5% during the useful life of the mask.

23. A lithography system for producing a pattern on a semiconductor wafer, the lithography system comprising:
a source of radiation;
a mask comprising a substrate with a layer disposed on at least a portion of the substrate, wherein the layer comprises a group IV, V or VI transitional metal nitride and silicon nitride $Si_xN_y$, the source of radiation positioned to direct at least a portion of the radiation at the mask.

24. The lithography system according to claim 23 wherein the group IV, V or VI transitional metal nitride comprises MoN and the silicon nitride $Si_xN_y$ comprises $Si_3N_4$.

25. The lithography system according to claim 23 wherein the group IV, V or VI transitional metal nitride comprises NbN and the silicon nitride $Si_xN_y$ comprises $Si_3N_4$.

26. The lithography system according to claim 23 wherein the group IV, V or VI transitional metal nitride comprises TiN and the silicon nitride $Si_xN_y$ comprises $Si_3N_4$.

27. The lithography system according to claim 23 wherein the group IV, V or VI transitional metal nitride comprises WN and the silicon nitride $Si_xN_y$ comprises $Si_3N_4$.

28. The lithography system according to claim 23 wherein the mask has a thickness between about 500 angstroms and 2000 angstroms.

29. The lithography system according to claim 23 wherein the layer is continuous.

30. The lithography system according to claim 23 wherein the group IV, V or VI transitional metal nitride comprises about ten to forty percent of the layer.

31. The lithography system according to claim 23 wherein the layer is radiation stable and etch selective.

32. The lithography system according to claim 30 wherein the layer has an etch selectivity of about 5:1 or more to the substrate and 2:1 or more to the resist material.

33. The lithography system according to claim 23 wherein the layer experiences a transmission change of no more than about 0.5% during the useful life of the mask.

34. The lithography system according to claim 23 further comprising a projection system positioned between the mask and the wafer.

35. An attenuated phase shift mask for use in lithography comprising a layer comprising a group IV, V or VI transitional metal nitride and silicon nitride $Si_xN_y$.

36. The attenuated phase shift mask according to claim 35 wherein the group IV, V or VI transitional metal nitride comprises MoN and the silicon nitride $Si_xN_y$ comprises $Si_3N_4$.

37. The attenuated phase shift mask according to claim 35 wherein the group IV, V or VI transitional metal nitride comprises NbN and the silicon nitride $Si_xN_y$ comprises $Si_3N_4$.

38. The attenuated phase shift mask according to claim 35 wherein the group IV, V or VI transitional metal nitride comprises TiN and the silicon nitride $Si_xN_y$ comprises $Si_3N_4$.

39. The attenuated phase shift mask according to claim 35 wherein the group IV, V or VI transitional metal nitride comprises WN and the silicon nitride $Si_xN_y$ comprises $Si_3N_4$.

40. The attenuated phase shift mask according to claim 35 wherein the mask has a thickness between about 500 angstroms and 2000 angstroms.

41. The attenuated phase shift mask according to claim 35 further comprising a substrate, the layer disposed at least partially on the substrate.

42. The attenuated phase shift mask according to claim 35 wherein the group IV, V or VI transitional metal nitride comprises about ten to forty percent of the layer.

43. The attenuated phase shift mask according to according to claim 35 wherein the layer is radiation stable and etch selective.

44. The attenuated phase shift mask according to claim 43 wherein the layer has an etch selectivity of about 5:1 or more to an underlying substrate and 2:1 or more to a resist material under the mask.

45. The attenuated phase shift mask according to claim 35 wherein the layer experiences a transmission change of no more than about 0.5% during the useful life of the mask.

46. A method for making an attenuated phase shift mask for use in lithography, the method comprising forming a single layer comprising a group IV, V or VI transitional metal nitride and silicon nitride $Si_xN_y$.

47. The method according to claim 46 wherein the group IV, V or VI transitional metal nitride comprises MoN and the silicon nitride $Si_xN_y$ comprises $Si_3N_4$.

48. The method according to claim 46 wherein the group IV, V or VI transitional metal nitride comprises NbN and the silicon nitride $Si_xN_y$ comprises $Si_3N_4$.

49. The method according to claim 46 wherein the group IV, V or VI transitional metal nitride comprises TiN and the silicon nitride $Si_xN_y$ comprises $Si_3N_4$.

50. The method according to claim 46 wherein the group IV, V or VI transitional metal nitride comprises WN and the silicon nitride $Si_xN_y$ comprises $Si_3N_4$.

51. The method according to claim 46 wherein the mask is formed to have a thickness between about 500 angstroms and 2000 angstroms.

52. The method according to claim 46 further comprising providing a substrate, wherein the single layer is formed at least partially on the substrate.

53. The method according to claim 46 wherein the group IV, V or VI transitional metal nitride comprises about ten to forty percent of the layer.

54. The method according to according to claim 46 wherein the layer is radiation stable and etch selective.

55. The method according to claim 54 wherein the layer has an etch selectivity of about 5:1 or more to an underlying substrate and 2:1 or more to a resist material under the mask.

56. The method according to claim 46 wherein the layer experiences a transmission change of no more than about 0.5% during the useful life of the mask.

57. An attenuated phase shift mask comprising:
a first layer; and
a second layer disposed at least partially on the first layer, wherein the first layer comprises a group IV, V or VI transitional metal nitride and the second layer comprises silicon nitride $Si_xN_y$ or the first layer comprises silicon nitride $Si_xN_y$ and the second layer comprises a group IV, V or VI transitional metal nitride.

58. The attenuated phase shift mask according to claim 57 further comprising a third layer disposed at least partially on the second layer, the third layer comprises a group IV, V or VI transitional metal nitride if the second layer comprises silicon nitride $Si_xN_y$ and comprises silicon nitride $Si_xN_y$ if the second layer comprises a group IV, V or VI transitional metal.

59. The attenuated phase shift mask according to claim 58 further comprising a fourth layer disposed at least partially on the third layer, the fourth layer comprises a group IV, V or VI transitional metal nitride if the third layer comprises silicon nitride $Si_xN_y$ and comprises silicon nitride $Si_xN_y$ if the third layer comprises a group IV, V or VI transitional metal.

60. The attenuated phase shift mask according to claim 57 wherein the group IV, V or VI transitional metal nitride comprises MoN and the silicon nitride $Si_xN_y$ comprises $Si_3N_4$.

61. The attenuated phase shift mask according to claim 57 wherein the group IV, V or VI transitional metal nitride comprises NbN and the silicon nitride $Si_xN_y$ comprises $Si_3N_4$.

62. The attenuated phase shift mask according to claim 57 wherein the group IV, V or VI transitional metal nitride comprises TiN and the silicon nitride $Si_xN_y$ comprises $Si_3N_4$.

63. The attenuated phase shift mask according to claim 57 wherein the group IV, V or VI transitional metal nitride comprises WN and the silicon nitride $Si_xN_y$ comprises $Si_3N_4$.

64. The attenuated phase shift mask according to claim 57 wherein the group IV, V or VI transitional metal nitride comprises about ten to forty percent of the mask.

65. The attenuated phase shift mask according to claim 57 wherein the mask has a thickness between about 500 angstroms and 2000 angstroms.

66. The attenuated phase shift mask according to claim 57 wherein the ratio of the thickness of the silicon nitride $Si_xN_y$ to the group IV, V or VI transitional metal nitride is about 85:15.

67. The attenuated phase shift mask according to claim 57 wherein the mask is radiation stable and etch selective.

68. The attenuated phase shift mask according to claim 67 wherein the mask has an etch selectivity of about 5:1 or more to an underlying substrate and 2:1 or more to an imaging material under the mask.

69. The attenuated phase shift mask according to claim 57 wherein the mask experiences a transmission change of no more than about 0.5% during the useful life of the mask.

70. A method for making an attenuated phase shift mask in lithography, the method comprising disposing a second layer at least partially on a first layer, wherein the first layer comprises a group IV, V or VI transitional metal nitride and the second layer comprises silicon nitride $Si_xN_y$ or the first layer comprises silicon nitride $Si_xN_y$ and the second layer comprises a group IV, V or VI transitional metal nitride.

71. The method according to claim 70 further comprising disposing a third layer at least partially on the second layer, the third layer comprising a group IV, V or VI transitional metal nitride if the second layer comprises silicon nitride $Si_xN_y$ and comprises silicon nitride $Si_xN_y$ second layer comprises a group IV, V or VI transitional metal.

72. The method according to claim 71 further comprising disposing a fourth layer at least partially on the third layer, the fourth layer comprises a group IV, V or VI transitional metal nitride if the third layer comprises $Si_xN_y$ and comprises silicon nitride $Si_xN_y$ if the third layer comprises a group IV, V or VI transitional metal.

73. The method according to claim 70 wherein the group IV, V or VI transitional metal nitride comprises TaN and the silicon nitride $Si_xN_y$ comprises $Si_3N_4$.

74. The method according to claim 70 wherein the group IV, V or VI transitional metal nitride comprises MoN and the silicon nitride $Si_xN_y$ comprises $Si_3N_4$.

75. The method according to claim 70 wherein the group IV, V or VI transitional metal nitride comprises NbN and the silicon nitride $Si_xN_y$ comprises $Si_3N_4$.

76. The method according to claim 70 wherein the group IV, V or VI transitional metal nitride comprises TiN and the silicon nitride $Si_xN_y$ comprises $Si_3N_4$.

77. The method according to claim 70 wherein the group IV, V or VI transitional metal nitride comprises WN and the silicon nitride $Si_xN_y$ comprises $Si_3N_4$.

78. The method according to claim 70 wherein the group IV, V or VI transitional metal nitride comprises about ten to forty percent of the mask.

79. The method according to claim 70 wherein the mask is formed to have a thickness between about 500 angstroms and 2000 angstroms.

80. The method according to claim 70 wherein the mask is formed so that the ratio of the thickness of the $Si_xN_y$ to the group IV, V or VI transitional metal nitride is about 85:15.

81. The method according to according to claim 70 wherein the mask is radiation stable and etch selective.

82. The method according to claim 80 wherein the mask has an etch selectivity of about 5:1 or more to an underlying substrate and 2:1 or more to an imaging material.

83. The method according to claim 70 wherein the mask experiences a transmission change of no more than about 0.5% during the useful life of the mask.

84. A lithography system for producing a pattern on a semiconductor wafer, the lithography system comprising:
a substrate;
a first layer disposed at least partially on the substrate;
a second layer disposed at least partially on the first layer, wherein the first layer comprises a group IV, V or VI transitional metal nitride and the second layer comprises silicon nitride $Si_xN_y$ or the first layer comprises silicon nitride $Si_xN_y$ and the second layer comprises a group IV, V or VI transitional metal nitride; and a source of radiation, the radiation directed at least partially at the mask.

85. The lithography system according to claim 84 further comprising:
   a third layer disposed at least partially on the second layer, the third layer comprises a group IV, V or VI transitional metal nitride if the second layer comprises silicon nitride $Si_xN_y$ and comprises silicon nitride $Si_xN_y$ if the second layer comprises a group IV, V or VI transitional metal; and
   a fourth layer disposed at least partially on the third layer, the fourth layer is a group IV, V or VI transitional metal nitride if the third layer is silicon nitride $Si_xN_y$ and is silicon nitride $Si_xN_y$ if the third layer is a group IV, V or VI transitional metal.

86. The lithography system according to claim 84 wherein the group IV, V or VI transitional metal nitride comprises TaN and the silicon nitride $Si_xN_y$ comprises $Si_3N_4$.

87. The lithography system according to claim 84 wherein the group IV, V or VI transitional metal nitride comprises MoN and the silicon nitride $Si_xN_y$ comprises $Si_3N_4$.

88. The lithography system according to claim 84 wherein the group IV, V or VI transitional metal nitride comprises NbN and the silicon nitride $Si_xN_y$ comprises $Si_3N_4$.

89. The lithography system according to claim 84 wherein the group IV, V or VI transitional metal nitride comprises TiN and the silicon nitride $Si_xN_y$ comprises $Si_3N_4$.

90. The lithography system according to claim 84 wherein the group IV, V or VI transitional metal nitride comprises WN and the silicon nitride $Si_xN_y$ comprises $Si_3N_4$.

91. The lithography system according to claim 84 wherein the group IV, V or VI transitional metal nitride comprises about ten to forty percent of the mask.

92. The lithography system according to claim 84 wherein the mask has a thickness between about 500 angstroms and 2000 angstroms.

93. The lithography system according to claim 84 wherein the ratio of the thickness of the silicon nitride $Si_xN_y$ to the group IV, V or VI transitional metal nitride is about 85:15.

94. The lithography system according to claim 84 wherein the first and second layer are radiation stable and etch selective.

95. The lithography system according to claim 94 wherein the first and second layers have an etch selectivity of about 5:1 or more to the substrate and 2:1 or more to an imaging material.

96. The lithography system according to claim 94 wherein the radiation stable first and second layers experience a transmission change of no more than about 0.5% during the useful life of the mask.

97. The attenuated phase shift mask according to claim 57 wherein the group IV, V or VI transitional metal nitride comprises TaN and the silicon nitride $Si_xN_y$ comprises $Si_3N_4$.

* * * * *